United States Patent [19]

Rachui et al.

[11] Patent Number: 5,868,519
[45] Date of Patent: Feb. 9, 1999

[54] BACKBRACKET THUMBSCREW ASSEMBLY

[75] Inventors: Roy Albert Rachui, Georgetown; Donald Lee Thompson, Austin, both of Tex.

[73] Assignee: International Business Machines Corporation, Armonk, N.Y.

[21] Appl. No.: 751,462

[22] Filed: Nov. 18, 1996

[51] Int. Cl.⁶ .................................................. B25G 3/36
[52] U.S. Cl. ........................ 403/386; 403/47; 403/348; 411/389
[58] Field of Search ............................ 403/47, 342, 383, 403/386; 411/389, 384

[56] References Cited

U.S. PATENT DOCUMENTS

| | | | |
|---|---|---|---|
| 937,577 | 10/1909 | Crump | 411/384 |
| 2,444,666 | 7/1948 | Orain | 403/47 |
| 3,415,553 | 12/1968 | Baugh | 411/384 X |
| 3,792,933 | 2/1974 | Stencel | 411/384 X |
| 4,540,322 | 9/1985 | Coffia | 411/389 X |
| 4,940,262 | 7/1990 | Baracat et al. | 403/342 X |
| 4,991,085 | 2/1991 | Pleva et al. | 364/200 |
| 5,163,833 | 11/1992 | Olsen et al. | 439/61 |
| 5,174,762 | 12/1992 | Hoppal et al. | 439/61 |
| 5,253,129 | 10/1993 | Blackborow et al. | 360/69 |
| 5,358,367 | 10/1994 | Yang | 411/389 X |
| 5,435,737 | 7/1995 | Haga et al. | 439/157 |
| 5,609,454 | 3/1997 | Lee | 411/384 |

*Primary Examiner*—Donald P. Walsh
*Assistant Examiner*—Emmanuel M. Marcelo
*Attorney, Agent, or Firm*—Volel Emile

[57] ABSTRACT

A thumbscrew apparatus for fastening a first device to a second device. In a first embodiment, the apparatus comprises a screw attached to the second device and a first cylinder screwed onto the screw for fastening the first device to the second device. The first cylinder has an outboard end with a one-way slot feature that allows a screwdriver to be used to loosen the first cylinder while inhibiting the use of the screwdriver to tighten the cylinder. In a second embodiment, the shaft of the screw has a first portion smaller in diameter than a second portion. The first portion also has a thread pitch smaller than that of the second portion. A second cylinder contained within the first cylinder is screwed onto the second portion of the shaft while the first cylinder is screwed onto the first portion. A pin is used to lock the first cylinder to the second cylinder such that both cylinders are turned at the same revolution. However, since the pitch of the second portion of the shaft is greater than that of the first portion, the second cylinder moves faster along the axis of the screw than the first cylinder. Hence, when both cylinders are being turned in the loosening direction, the second cylinder pushes the screwdriver out of the one-way slot of the outboard end of the first cylinder before the first cylinder reaches the end of its travel.

14 Claims, 3 Drawing Sheets

BACKBRACKET THUMBSCREW ASSEMBLY

BACKGROUND OF THE INVENTION

1. Field of the Invention

The present invention relates generally to a fastening device for securing an adapter card to a computer system and, more particularly, to a thumbscrew assembly for fastening the adapter card to the computer system.

2. Description of the Related Art

Modern computer systems are commonly designed to accommodate adapter cards. The adapter cards are added to the computer systems by being inserted each into a socket in the systems' motherboard. Often times, the cards are grounded by being fastened to the chassis of the computer systems using a thumbscrew. Most thumbscrews are integrated in the metal cover of the computer system. In addition, the thumbscrews often have a slotted head to facilitate the use of a screwdriver for tightening and loosening purposes. When a screwdriver is used to loosen a thumbscrew, there is always a likelihood that it will also be used to unscrew the thumbscrew. As is well known, it is very easy to exert more force than necessary when using a screwdriver. As a result, the thumbscrew may be overtightened, stripping its threads or be broken off by applying too much force after the thumbscrew has traveled to the end of its threads. When any one of the above occurs, the entire metal cover of the computer system has to be replaced, a relatively expensive remedy.

Thus, there is a need in the art for an apparatus that prevents a thumbscrew from being overtightened or broken.

SUMMARY OF THE INVENTION

The need in the art is addressed by the present invention. The present invention provides an apparatus for fastening a first device to a second device. In a first embodiment, the apparatus comprises a screw attached to the second device and a first cylinder screwed onto the screw for fastening the first device to the second device. The first cylinder has an outboard end with a one-way slot feature that allows a screwdriver to be used to loosen the first cylinder while inhibiting the use of the screwdriver to tighten the cylinder.

In a second embodiment, the shaft of the screw has a first portion smaller in diameter than a second portion. The first portion also has a thread pitch smaller than that of the second portion. A second cylinder contained within the first cylinder is screwed onto the second portion of the shaft while the first cylinder is screwed onto the first portion. A pin is used to lock the first cylinder to the second cylinder such that both cylinders are turned at the same revolution. However, since the pitch of the second portion of the shaft is greater than that of the first portion, the second cylinder moves faster than the first cylinder along the axis of the screw. Hence, when both cylinders are being turned in the loosening direction, the second cylinder pushes the screwdriver out of the one-way slot of the outboard end of the first cylinder before the first cylinder reaches the end of its threads.

BRIEF DESCRIPTION OF THE DRAWING

FIG. 1(*b*) depicts the adapter card of FIG. 1(*a*) fastened to a cover set by the thumbscrew of the present invention.

FIG. 1(*c*) depicts a wire and the thumbscrew assembly of the present invention.

FIG. 1(*d*) depicts the wire of FIG. 1(*c*) fastened to the device using the thumbscrew assembly of the present invention.

FIG. 3(*b*) depicts the thumbscrew of the present invention in a loosening position.

DESCRIPTION OF THE INVENTION

Figure 1A:
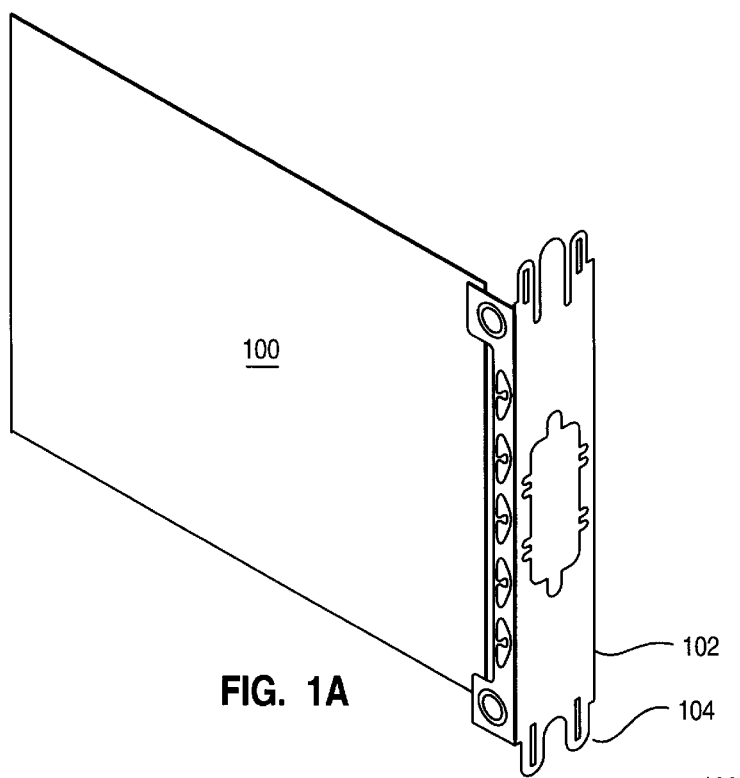
FIG. 1(*a*) depicts an adapter card and a thumbscrew of the present invention.
Figure 1B:
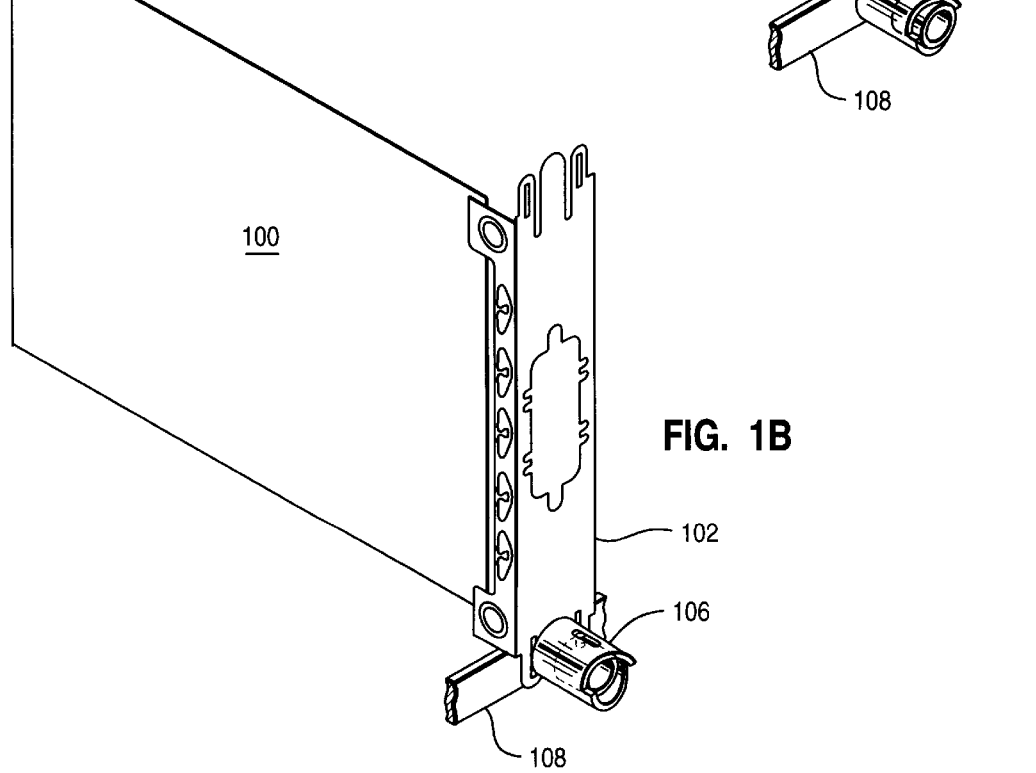
Figure 1C:
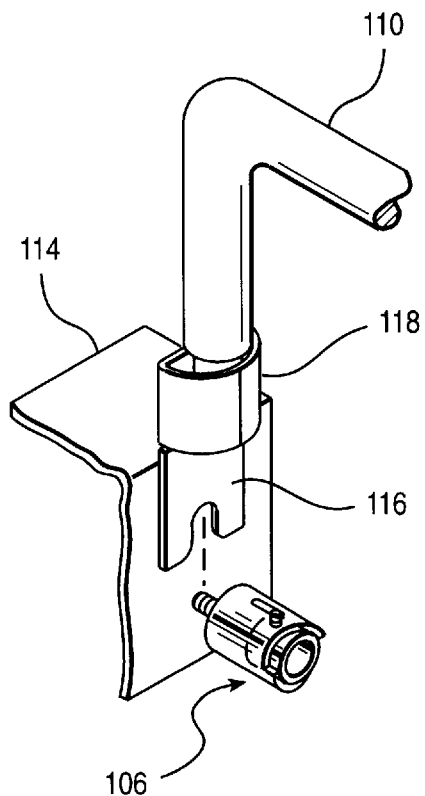
Figure 1D:
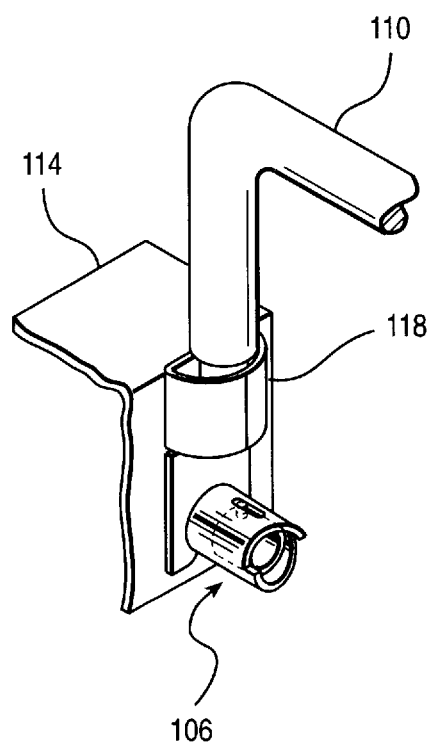

FIG. 1(*a*) depicts an adapter card and a thumbscrew of the present invention. The adapter card comprises a circuit board 100 and a sheet metal bracket 102 with a notch 104 for accommodating a thumbscrew assembly 106. The thumbscrew assembly 106 is shown attached to a part 108 of a cover (not shown). FIG. 1(*b*) depicts the adapter card of FIG. 1(*a*) fastened to the cover (via part 108) by the thumbscrew assembly 106.

FIG. 1(*c*) depicts a wire 110 and the thumbscrew assembly 106 of the present invention. The wire 110 has a terminal 116 with a notch to accommodate the thumbscrew assembly 106. The wire 110 is attached to a device 114 by a retainer 118. The device 114 may be part of an audio (e.g., stereo) system, speaker, video equipment, telephone equipment or any equipment to which a wire terminal such as an antenna, electrical wire, etc. may have to be attached. FIG. 1(*d*) depicts the wire 110 fastened to the device 114 using the thumbscrew assembly 106.

Figure 2:
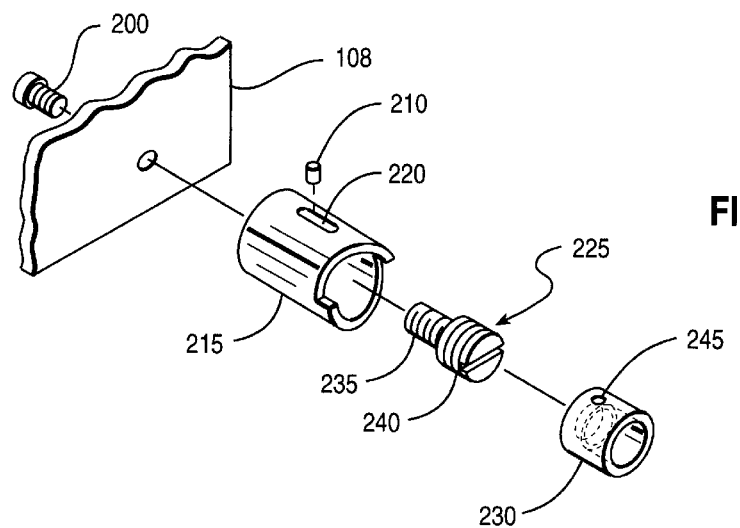
FIG. 2 illustrates the thumbscrew of the present invention.

FIG. 2 illustrates the thumbscrew assembly 106. The thumbscrew assembly 106 comprises a fastener 200, a pin 210, an outer cylinder 215 with a slot 220, a bolt 225 and an inner cylinder 230 with a hole 245. The fastener 200 is used to fasten the thumbscrew assembly 106 to the cover (or any one of the devices mentioned above). The fastener 200 can be any of a variety of fastening devices and can be either screwed, welded, riveted, glued etc. to the cover of the computer and thumbscrew assembly 106. In the present case, the fastener 200 is a screw making the thumbscrew assembly 106 a field replaceable unit.

The bolt 225 has three threaded surfaces. An inward threaded surface into which the fastener 200 is screwed into the bolt 225 to fasten the thumbscrew assembly 106 to the cover of the computer system and two outward threaded surfaces, surfaces 235 and 240. As can be seen, the pitch of the thread and the circumference of the surface 235 are different from those of the surface 240. The outer cylinder 215 is knurled and screwed onto the surface 235 and the inner cylinder 230 is screwed onto the surface 240. The pin 210, inserted into the hole 245 of inner cylinder 230, extends through the slot 220 of outer cylinder 215; thus pinning the outer cylinder 215 to the inner cylinder 230. Consequently, when the outer cylinder 215 is turned as to screw or unscrew the thumbscrew assembly 106, both the inner cylinder 245 and the outer cylinder 215 move in the axial direction of the bolt 225 without any relative rotational motion. The bolt 225 has a slotted head to allow the thumbscrew assembly 106 to be fastened/unfastened to the cover of the computer system with the use of a screwdriver. Note that the bolt 225 only moves when the thumbscrew assembly is being fastened/unfastened to the cover of the system.

The outer cylinder 215 has a one-way slot feature in its outboard end that allows for the use of a screwdriver to loosen the thumbscrew assembly 106 while preventing the screwdriver's use to tighten the thumbscrew. The inboard end of the outer cylinder 215 is closed in. The enclosure has an opening that allows the outer cylinder 215 to screw onto an M4×0.7 thread pitch of the surface 235 of the bolt 225. Similarly, the inner cylinder 230 has a closed inboard end with an opening that allows it to screw onto an M6×1.0 thread pitch of the surface 240 of the bolt 225. The diameter of the inner surface of the outer cylinder 215 is greater than the diameter of the outer surface of the inner cylinder 230. Likewise, the diameter of the inner surface of the inner cylinder 230 is greater than that of the surface 240 of bolt 225.

When the thumbscrew assembly 106 is rotated in the loosening direction, the difference in thread pitch (i.e., 0.7 mm vs. 1.0 mm per revolution) causes the inner cylinder 245 to move out faster than the outer cylinder 215 (on which a screwdriver may be acting). Before the thumbscrew assembly 106 reaches the end of its travel, the inner cylinder 230 pushes the screwdriver blade out of the one-way slot feature of the outer cylinder 215, effectively eliminating the possibility of breaking the thumbscrew assembly 106.

Figure 3A:
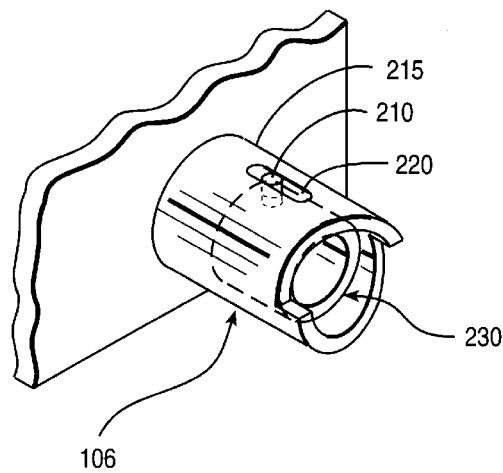
FIG. 3(*a*) depicts the thumbscrew of the present invention in a tightening position.
Figure 3B:
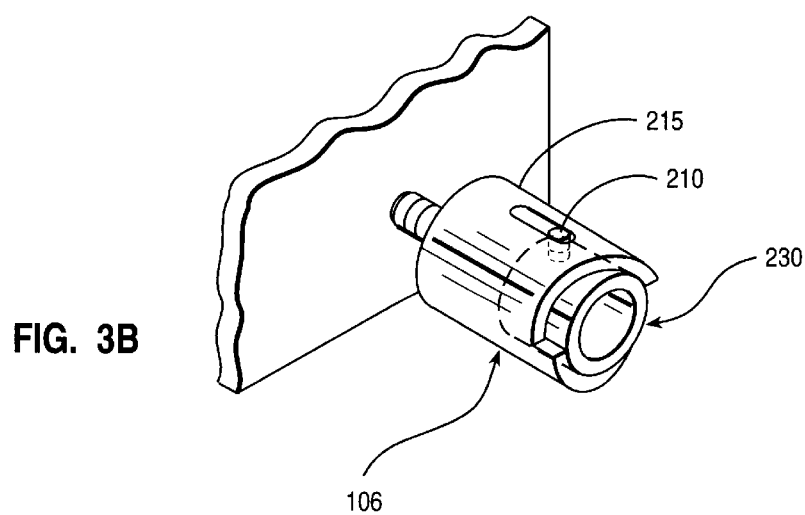

FIG. 3(a) depicts the thumbscrew assembly 106 in a tightening position while FIG. 3(b) shows it in a loosening position. In FIG. 3(a), the outboard end, which has the one-way slot feature, of the outer cylinder 215 protrudes farther out than the outboard end of the inner cylinder 230. This, therefore, allows a screwdriver to be used to loosen the thumbscrew assembly 106 when necessary. In FIG. 3(b), however, the outboard end of the outer cylinder 215 is flush with that of the inner cylinder 230; thus, inhibiting the use of a screwdriver. Note that the slot 220 allows the pin 210 inserted into the inner cylinder 230 to move relative to the outer cylinder 215.

Although the present invention has been fully described above with reference to specific embodiments, other alternative embodiments will be apparent to those of ordinary skill in the art. Therefore, the above description should not be taken as limiting the scope of the present invention defined by the appended claims.

What is claimed is:

1. A fastening apparatus comprising:
   a screw, said screw includes a shaft having a first portion with a first diameter and a second portion with a second diameter, said first diameter being smaller than said second diameter;
   a first cylinder screwed onto said screw, said first cylinder having an outboard end with a slot having means for allowing a screw-turning tool to loosen or unscrew said first cylinder and for precluding said screw-turning tool to screw said first cylinder, said first cylinder further having a first length and a closed-in inboard end with an aperture for screwing said first cylinder onto said first portion; and
   a second cylinder screwed onto said second portion, said second cylinder having a second length, said second length being shorter than said first length, said second cylinder being smaller in diameter than said first cylinder wherein said second cylinder when screwed onto said second portion of said shaft is within said first cylinder.

2. The apparatus of claim 1 wherein said first portion of said shaft has a smaller thread pitch than said second portion of said shaft.

3. The apparatus of claim 2 further comprising a pin, said second cylinder including a hole for accommodating said pin and said first cylinder has a slot for accommodating said pin, said pin being used for pinning said first cylinder to said second cylinder such that when said first cylinder turning, said second cylinder is also turning.

4. The apparatus of claim 3 wherein when said first and said second cylinders are turning, said second cylinder moves faster on said second portion of said shaft than said first cylinder moves on said first portion of said shaft, such that when said first and said second cylinders are turning in a loosening direction said second cylinder pushes away said screw-turning tool.

5. The apparatus of claim 4 wherein said first cylinder is knurled.

6. An apparatus having a fastening means, said fastening means for fastening a device to said apparatus, said fastening means comprising:
   a screw attached to said apparatus, said screw including a shaft having a first portion with a first diameter and a second portion with a second diameter, said first diameter being smaller than said second diameter; and
   a first cylinder screwed onto said screw for fastening said apparatus to said device, said first cylinder having an outboard end with a slot, said slot having means for allowing a screw-turning tool to loosen or unscrew said first cylinder and for precluding said screw-turning tool to unscrew said first cylinder, said first cylinder further having a first length and a closed-in inboard end with an aperture for screwing said first cylinder onto said first portion; and
   a second cylinder screwed onto said second portion, said second cylinder having a second length, said second length being shorter than said first length, said second cylinder being smaller in diameter than said first cylinder wherein said second cylinder when screwed onto said second portion of said shaft is within said first cylinder.

7. The apparatus of claim 6 wherein said first portion of said shaft has a smaller thread pitch than said second portion of said shaft.

8. The apparatus of claim 7 wherein said fastening means further comprises a pin, said second cylinder including a hole for accommodating said pin and said first cylinder includes a slot for accommodating said pin, said pin being used for pinning said first cylinder to said second cylinder such that when said first cylinder is turned, said second cylinder is also turned.

9. The apparatus of claim 8 wherein when said first and said second cylinders are turning, said second cylinder moves faster on said second portion of said shaft than said first cylinder moves on said first portion of said shaft such that when said first and said second cylinders are turning in a loosening direction said second cylinder pushes away said screw-turning tool.

10. The apparatus of claim 9 wherein said first cylinder is knurled.

11. An apparatus comprising:
    a screw having a threaded lower part and a threaded upper part;
    a first cylinder for screwing onto said threaded upper part, said first cylinder having a hole;
    a second cylinder for screwing onto said threaded lower part, said second cylinder enclosing said first cylinder, said second cylinder having a slot at one end and an aperture along its longitudinal axis, said slot for accommodating a screw-turning tool;

a pin, said pin being inserted in said aperture and said hole such that said first cylinder rotationally moves as said second cylinder rotationally moves.

12. The apparatus of claim 11 wherein said threaded upper part being of a different pitch and diameter from said threaded lower part.

13. The apparatus of claim 12 wherein said aperture is an elongated aperture allowing said first cylinder to move up and down in relation to said second cylinder such that when said screw-turning tool rotationally moves said second cylinder in a counterclockwise direction said first cylinder slowly pushes said screw-turning tool out of said slot.

14. The apparatus of claim 13 wherein said slot is a one-way slot feature allowing said screw-turning tool to be used when said second cylinder is to be rotationally moved in a counterclockwise direction and precluding said screw-turning tool to be used when said second cylinder is to be rotationally moved in a clockwise direction.

* * * * *